United States Patent
Hatwar et al.

(10) Patent No.: US 6,475,648 B1
(45) Date of Patent: Nov. 5, 2002

(54) ORGANIC ELECTROLUMINESCENT DEVICES WITH IMPROVED STABILITY AND EFFICIENCY

(75) Inventors: Tukaram K. Hatwar, Penfield; Gopalan Rajeswaran, Fairport; Ching W. Tang, Rochester; Jianmin Shi, Webster, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/589,731

(22) Filed: Jun. 8, 2000

(51) Int. Cl.$^7$ ............................................... H05B 33/14
(52) U.S. Cl. ....................... 428/690; 428/914; 428/704; 313/504; 313/506; 252/301.16; 252/301.35; 257/40; 257/103
(58) Field of Search ................... 428/690, 917, 428/704; 313/504, 506; 252/301.35, 301.16; 257/40, 103

(56) References Cited

U.S. PATENT DOCUMENTS

| | | | |
|---|---|---|---|
| 4,539,507 A | | 9/1985 | VanSlyke et al. |
| 4,769,292 A | | 9/1988 | Tang et al. |
| 4,885,211 A | | 12/1989 | Tang et al. |
| 5,059,062 A | | 10/1991 | Bresnahan |
| 5,601,903 A | * | 2/1997 | Fujii et al. .................. 428/212 |
| 5,776,622 A | | 7/1998 | Hung et al. |
| 5,853,905 A | | 12/1998 | So et al. |
| 5,908,581 A | * | 6/1999 | Chen et al. .................... 546/94 |
| 5,935,721 A | * | 8/1999 | Shi et al. ..................... 428/690 |

OTHER PUBLICATIONS

Improving the Efficiency and Stability of Organic Light EmmittingDevices by Using Mixed Emitting Layers, by Popavic et al., SPIE Conference Proceedings vol. 3476, p. 68–72, 1998.

"Red Organic Light–Emitting Diodes Using An Emitting Assist Dopant", by Hamada et al. Applied Physics Letter vol. 75, No. 12, pp. 1682–1684 (1999).

"Improved Red Dopants For Organic Electroluminescent Devices", by Chen et al., Macromol, Symp. 125, 49–58 (1997).

\* cited by examiner

Primary Examiner—Cynthia H. Kelly
Assistant Examiner—Ling Xu
(74) Attorney, Agent, or Firm—Raymond L. Owens (57) ABSTRACT

An organic luminescent layer for use in an electroluminescent device with improved operating life includes an organic host material capable of sustaining both hole and electron injection and recombination. The layer also includes at least two dopants: a first dopant capable of accepting energy of electron-hole combinations in the host material; and a second dopant capable of trapping the holes from the host material. The first dopant being selected so that the bandgap energy of the first dopant is less than the bandgap energy of the host material and the second dopant being selected to have a hole trapping energy level above the valance band of the host material.

11 Claims, 6 Drawing Sheets

ORGANIC ELECTROLUMINESCENT DEVICES WITH IMPROVED STABILITY AND EFFICIENCY

FIELD OF THE INVENTION

The present invention relates to organic electroluminescent devices and more particularly to an emission layer with suitable dopants for improving operational stability and efficiency of these devices.

BACKGROUND OF THE INVENTION

An OLED device includes a substrate, an anode, a hole-transporting layer made of an organic compound, an organic luminescent layer with suitable dopants, an organic electron transport layer, and a cathode. EL devices are attractive because of their low driving voltage, high luminance, wide-angle viewing and capability for full-color flat emission displays. Tang et al. described this multilayer EL device in their commonly assigned U.S. Pat. Nos. 4,769,292 and 4,885,211.

The following patents and publications disclose the preparation of EL devices with improved operational lifetime. Structure modifications, stable cathode and confinement of carriers and their recombination in the emission zone achieved significant improvement in the operation stability of these devices. So et al. discussed an EL device in U.S. Pat. No. 5,853,905 consisting of a single organic emission layer with a mixture of electron transport and hole transport material, sandwiched between anode and cathode. However, this device has low efficiency.

Popovic et al. described an EL device in SPIE Conference proceedings Vol. 3476, p. 68–72, 1998 with improved efficiency and stability by mixing emitting electron transport material and the hole transport material. Chen et al. reported a highly efficient red color device where Alq emission layer is doped with DCJTB. (U.S. Pat. No. 5,908,581 and Micromol. Symp. 25, 490 (1997)).

Hamada et al. reported in Applied Phys. Lett. 75,1682 (1999) a red EL device by doping rubrene and $DCM_2$ dopants into Alq emission layer. With the prospect of using these EL devices in display screens for laptop computers, digital personal organizers, cellular phone etc., there is a need for EL device with much stable operation for luminance and driving voltage.

SUMMARY OF THE INVENTION

It is therefore an object of the present invention to provide an EL device with improved operational stability and luminance efficiency.

This object is achieved by an organic luminescent layer for use in an electroluminescent device with improved operating life, comprising:
a) an organic host material capable of sustaining both hole and electron injection and recombination; and
b) at least two dopants:
  i) a first dopant capable of accepting energy of electron-hole combinations in the host material; and
  ii) a second dopant capable of trapping the holes from the host material; and
c) the first dopant being selected so that the bandgap energy of the first dopant is less than the bandgap energy of the host material; and
d) the second dopant being selected to have a hole trapping energy level above the valence band of the host material.

A feature of the present invention is that by properly selecting the first and second dopants, the operating life of an electroluminescent device incorporating the electroluminescent layer can be significantly improved.

Another feature of the invention is that it can be used to provide an electroluminescent device with improved chromaticity.

Another feature of the invention is that it can be used to provide an electroluminescent device with improved operational stability at high luminance output.

Another feature of the invention is that it can be used with a low voltage drive source.

Quite unexpectedly, it has been found in this invention that synergetic effect of doping exciton trapping dopant and hole trapping dopant was such that better operational stability and efficiency were obtained at lower concentrations of the dopants. This resulted in improvements in operating lifetime and luminance efficiency. With an additional third luminescent dopant for controlling the color of the emission, excellent color chromicity was obtained, which could not be achieved with any other combination.

The devices made in accordance with the present invention are highly stable and have excellent luminance properties.

The drawings are necessarily of a schematic nature, since the thicknesses of the individual layers are too thin and thickness differences of the various elements too great to permit depiction to scale or to permit convenient proportionate scaling.

DETAILED DESCRIPTION OF THE INVENTION

Figure 1:
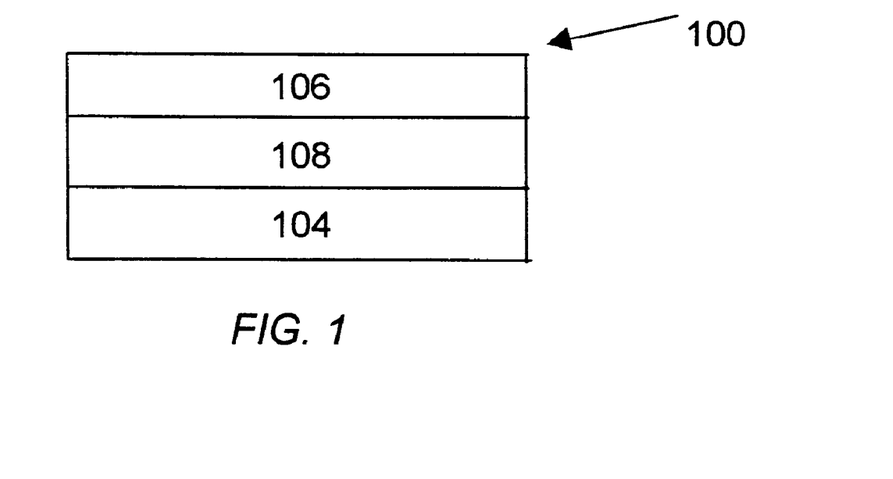
FIG. 1 is simple structure of an organic light-emitting device.

The light-emitting layer of the organic EL device comprises a luminescent or fluorescent material where electroluminescence is produced as a result of electron-hole pair recombination in this region. In the simplest construction, as shown in FIG. 1, the light-emitting layer 108 is sandwiched between anode 104 and cathode 106. The light-emitting layer is a pure material with a high luminescent efficiency. A well known material is tris(8-quinolinato) aluminum, (Alq), which produces excellent green electroluminescence.

Figure 2:
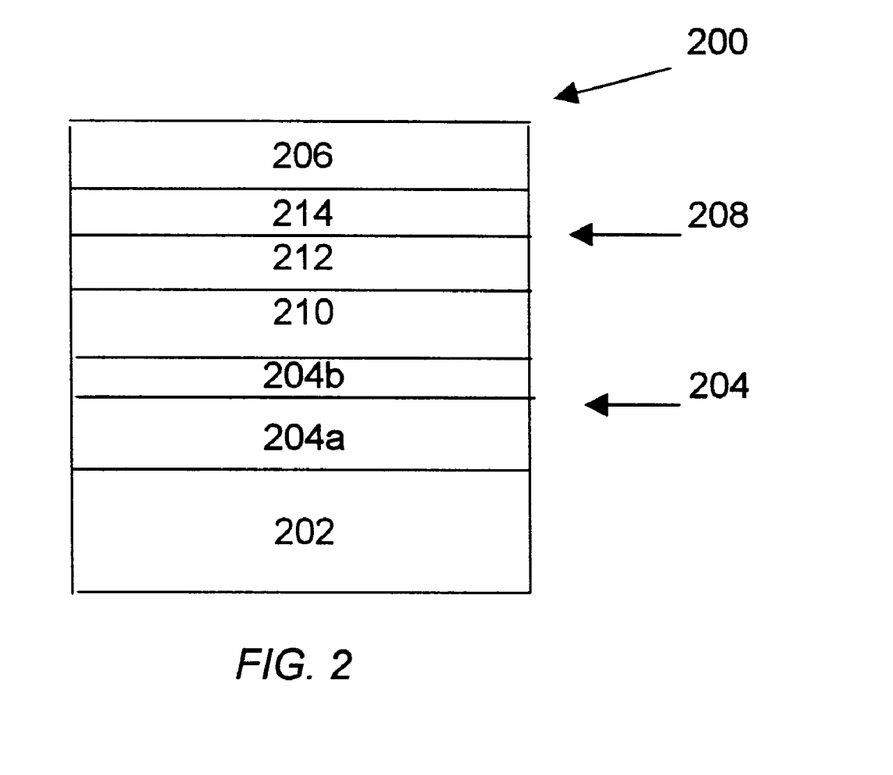
FIG. 2 is a schematic diagram of an organic light-emitting device in which a light-emitting structure is deposited over an ITO anode with an emission layer prepared according to the present invention.

The simple structure 100 can be modified to a three-layer structure as shown in FIG. 2, in which an additional electroluminescent layer is introduced between the hole and electron-transporting layers to function primarily as the site for hole-electron recombination and thus electroluminescence. In this respect, the functions of the individual organic layers are distinct and can therefore be optimized independently. Thus, the electroluminescent or recombination layer can be chosen to have a desirable EL color as well as high luminance efficiency. Likewise, the electron and hole transport layers can be optimized primarily for the carrier transport property.

Turning to FIG. 2, a multilayer organic light-emitting device 200 has a light-transmissive substrate 202 on which is disposed a light-transmissive anode 204. The anode 204 comprises two layers 204a and 204b. An organic light-emitting structure 208 is formed between the anode 204 and a cathode 206. The organic light-emitting structure 208 is comprised of, in sequence, an organic hole-transporting layer 210, an organic light-emitting layer 212, and an organic electron-transporting layer 214. When an electrical potential difference (not shown) is applied between the anode 204 and the cathode 206, the cathode will inject electrons into the electron-transporting layer 214, and the electrons will migrate across layer 214 to the light-emitting layer 212. At the same time, holes will be injected from the anode 204 into the hole-transporting layer 210. The holes will migrate across layer 210 and recombine with electrons at or near a junction formed between the hole-transporting layer 210 and the light-emitting layer 212. When a migrating electron drops from its conduction band to a valance band in filling a hole, energy is released as light, and is emitted through the light-transmissive anode 204 and substrate 202.

The organic EL devices can be viewed as a diode, which is forward biased when the anode is at a higher potential than the cathode. The anode and cathode of the organic EL device can each take any convenient conventional form, such as any of the various forms disclosed by Tang et al. U.S. Pat. No. 4,885,211. Operating voltage can be substantially reduced when using a low-work function cathode and a high-work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitutes one preferred cathode construction. The Al:Mg cathodes of Van Slyke et al. U.S. Pat. No. 5,059,862 are another preferred cathode construction. Hung et al. in U.S. Pat. No. 5,776,622 has disclosed the use of a LiF/Al bilayer to enhanced electron injection in organic EL devices.

Conventional anodes 204a are formed of a conductive and transparent oxide. Indium tin oxide has been widely used as the anode contact because of its transparency, good conductivity, and high work function.

In a preferred embodiment, an anode 204a can be modified with a hole injection layer 204b. An example of material in such a hole injection layer are the fluorocarbons disclosed by Hung U.S. patent application Ser. No. 09/186,829 filed Nov. 5, 1998, the disclosure of which is incorporated herein by reference.

Preferred host materials for the emission layer include:
a) Alq, and b)

; or c)

Preferred materials for use in forming the electron-transporting layer of the organic EL devices of this invention are metal chelated oxinoid compounds, including chelates of oxine itself (also commonly referred to as 8-quinolinol or 8-hydroxyquinoline) as disclosed in U.S. Pat. No. 4,885,211. Such compounds exhibit both high levels of performance and are readily fabricated in the form of thin layers.

The light-transmissive substrate 202 may be constructed of glass, quartz, or a plastic material. Preferred materials for use in forming the hole transport layer of the organic EJL devices are tertiary amines as taught in Van Slyke U.S. Pat. No. 4,539,507. Another class of preferred amines is tetraaryl amines. Preferred tetraaryldiamines include two diarylamino groups. Preferred tetraaryldiamines include those represented by the formula:

wherein:
   Ar, $Ar^1$, $Ar^2$ and $Ar^3$ are independently selected from among phenyl, biphenyl and naphthyl moieties;
   L is a divalent naphthalene moiety or $d_n$;
   d is a phenylene moiety;
   n is an integer of from 1 to 4; and
   at least one of Ar, $Ar^1$, $Ar^2$ and $Ar^3$ is a naphthenyl moiety when L is $d_n$.

Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. When the aryl and arylene moieties are not fused aromatic ring moieties, they are preferably phenyl and phenylene moieties.

Illustrative of useful selected (fused aromatic ring containing) aromatic tertiary amines are the following:

ATA-1 4,4'-Bis[N-(1-naphthyl)-N-phenylamino]biphenyl (NPB)
ATA-2 4,4"-Bis[N-(1-naphthyl)-N-phenylamino]-p-terphenyl
ATA-3 4,4'-Bis[N-(2-naphthyl)-N-phenylamino]biphenyl
ATA-4 4,4'-Bis[N-(3-acenaphthenyl)-N-phenyl-amino]biphenyl
ATA-5 1,5-Bis[N-(1-naphthyl)-N-phenylamino]naphthalene
ATA-6 4,4'-Bis[N-(9-anthryl)-N-phenylamino]-biphenyl
ATA-7 4,4"-Bis[N-(1-anthryl)-N-phenylamino]-p-terphenyl
ATA-8 4,4'-Bis[N-(2-phenanthryl)-N-phenyl-amino]biphenyl
ATA-9 4,4'-Bis[N-(8-fluoranthenyl)-N-phenyl-amino]biphenyl
ATA-10 4,4'-Bis[N-(2-pyrenyl)-N-phenylamino]biphenyl
ATA-11 4,4'-Bis[N-(2-naphthacenyl)-N-phenyl-amino]biphenyl
ATA-12 4,4'-Bis[N-(2-perylenyl)-N-phenylamino]biphenyl
ATA-13 4,4'-Bis[N-(1-coronenyl)-N-phenylamino]biphenyl
ATA-14 2,6-Bis(di-p-tolylamino)naphthalene
ATA-15 2,6-Bis[di-(1-naphthyl)amino]naphthalene
ATA-16 2,6-Bis[N-(1-naphthyl)-N-(2-naphthyl)-amino]naphthalene
ATA-17 N,N,N',N'-Tetra(2-naphthyl)-4,4"-di-amino-p-terphenyl
ATA-18 4,4'-Bis {N-phenyl-N-[4-(1-naphthyl)-phenyl]amino}biphenyl
ATA-19 4,4'-Bis[N-phenyl-N-(2-pyrenyl)amino]biphenyl
ATA-20 2,6-Bis[N,N-di(2-naphthyl)amine]fluorene
ATA-21 1,5-Bis[N-(1-naphthyl)-N-phenylamino]naphthalene

A preferred embodiment of the luminescent layer consists of a host material doped with fluorescent dyes. Using this method, highly efficient EL devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable details for EL devices using Alq as the host material.

Figure 3:
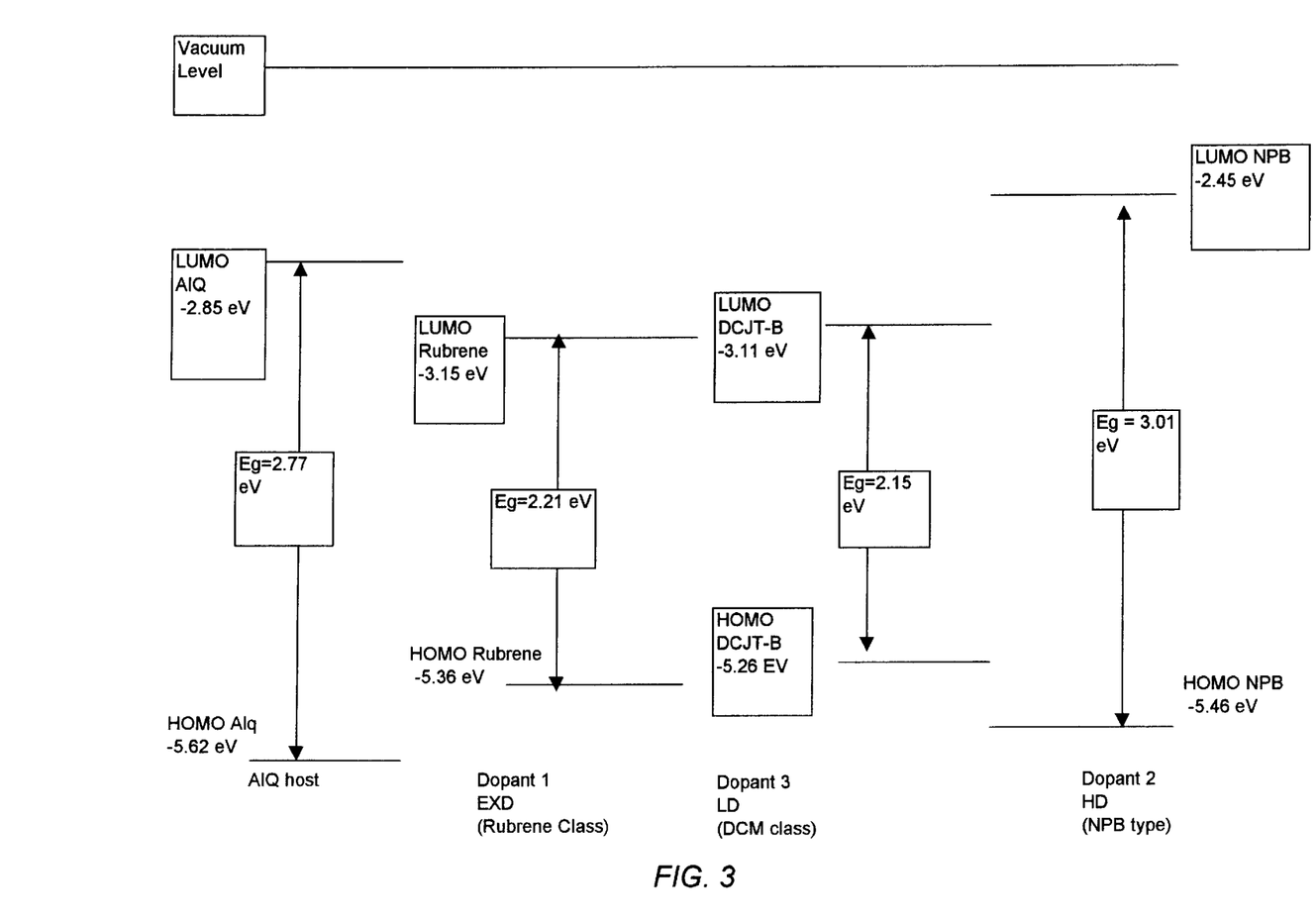
FIG. 3 shows a graphic representation of the energy level diagram of the Alq host, exciton trapping dopant (EXD) (dopant 1), hole trapping dopant (HD) (dopant 2) and luminescent dopant (LD) (dopant 3) in the emission layer.

FIG. 3 describes the energy level diagram of the organic emission layer host and the three kinds of dopants used in this invention. This figure refers specifically to an organic emissive layer consisting of a Alq host material and the three dopants: exciton-trapping dopant, hole-trapping dopant, and luminescent dopant.

A hole trap in Alq, for example, is defined as the dopant which has a bandgap greater than that of Alq, and is capable of donating an electron to Alq. The later condition is satisfied if the highest occupied molecular orbital (HOMO) of the dopant is higher (in electron energy scale) than that of Alq. Experimentally, the HOMO level is measured as the ionization potential with respect to the vacuum level. The ionization potential (IP) of the hole trapping dopant in Alq is determined to be lower than that of the (Alq) host. The IP of Alq is 5.62 eV. The hole trapping dopant, when filled is positively charged.

Preferred materials for use as a hole trap dopant of the organic EL devices are tetraaryl amines. Some of the arylamines class materials and their ionization potentials are given below.

HD1:

HD2:

HD3 (NPB):

HD4:

An exciton trap in Alq, for example, is defined as the dopant, which has band gap energy less than that of Alq host material and the trap, when filled, remains electronically neutral.

Preferred materials for uses as an exciton trap dopant of the organic EL devices are rubrene class materials. Some of the rubrene class materials.

EXD1:

EXD2:

EXD3:

EXD4(rubrene):

The luminescent dopant has a bandgap less than the bandgap energy of the first exciton dopant. The exciton dopant is capable of accepting energy from the electron-hole combination in the host material and accepting energy transferred from the second dopant.

Preferred materials for use as luminescent dopant of the organic EL devices is DCM class materials. Some of the DCJTB structures are given below.

LD1:

LD2:

LD3:

LD4:

LD5:

LD6:

LD7 (DCJTB):

NPB has been used as a hole-trapping dopant, rubrene as an exciton trapping dopant, and DCJTB as a luminescent dopant into the Alq emission layer as examples illustrating this invention. The energy levels of these materials are shown in FIG. 3.

Several devices were prepared on the glass substrate using ITO anode and Mg:Ag or LiF/Al cathode in accordance with a device structure as described in FIG. 2. The structure of the device is glass substrate/ITO anode/CFx hole injection layer/NPB hole transport layer/Alq emission layer with dopant(s)/Alq electron transport layer/Mg:Ag or LiF/Al.

The ranges of concentration of various dopants in the Alq emission layer used in the EL devices are preferably as follows:

Exciton trapping dopant=1–25%, hole trapping dopant=0.1–35%, and luminescent dopant=0.05–4%.

Several devices have been prepared using the above dopants. The results are summarized in Tables 1 and 2.

Devices prepared doping both exciton dopant and hole trapping dopant have shown significantly higher efficiency and the operational stability as compared to the devices doped with either dopant. Furthermore, the synergetic effect of doping exciton trapping dopant and hole trapping dopant was such that better operational stability and efficiency were obtained. With the addition of third luminescent dopant, excellent color coordinates were obtained with high luminance efficiency, which could not be achieved with any other combination.

The invention and its advantages are further illustrated by the specific examples which follow. The term "percentage" indicates the volume percentage of a particular dopant with respect to the host material.

EXAMPLE 1

An EL device was constructed in the following manner:

Substrates coated with 80 nm ITO were sequentially ultrasonicated in a commercial detergent, rinsed in deionized water, degreased in toluene vapor. These substrates were treated with an oxygen plasma for about one minute and coated with 1 nm fluorocarbon layer by plasma assisted deposition of $CHF_3$.

These substrates were loaded into a deposition chamber for organic layers and cathode depositions.

Device A was prepared by sequential deposition of 150 nm NPB hole transporting layer, followed by 37.5 nm Alq emission layer without any dopant (EML), 37.5 nm Alq electron transport layer (ETL), then 0.5 nm LiF and 200 nm Al as a part of cathode. The above sequence completed the deposition of the EL device.

The EL device was then hermetically packaged in a dry glove box filled with nitrogen for protection against ambient environment. The ITO patterned substrates used for preparing these EL devices contained several icons. Each individual icon of the device was tested for current voltage characteristics and the electroluminescence yield.

EXAMPLE 2

Device B was prepared following the same sequence as Device A except the 37.5 Alq emission layer was doped with 10% rubrene, exciton dopant 1.

EXAMPLE 3

Device C was prepared following the same sequence as Device A except the 37.5 Alq emission layer was doped with 10% NPB, hole trap dopant 2.

EXAMPLE 4

Device D was prepared following the same sequence as Device A except the 37.5 Alq emission layer was doped with 5% rubrene and 5% NPB. The deposition rate and thus the volume percentage of the Alq host and the two dopants was controlled by the boat temperature.

The luminance characteristics of these devices are shown in Table 1. The Device A has 3.17 cd/A luminance yield at 20 $mA/cm^2$ current density. This device has EL peak position at 532 nm and has green color. When the Alq emission layer was doped with 10% rubrene for Device B, the luminance yield was 4.68 cd/A. The EL peak position was at 568 nm giving yellow emission. When the Alq emission layer was doped with 10% NPB, the luminance yield for Device C increased to 3.27 cd/A @20 mA/cm². The EL peak position is at 528 nm and has green color. When the Alq emission layer was co-doped with 5% rubrene and 5% NPB, the luminance yield for the Device D was 4.95 cd/A and the EL peak position was at 568 nm giving yellow emission.

The operational stability of the encapsulated devices in ambient environments has been found by measuring the changes in the drive voltage and the luminance as a function of time when four different icons of each of these devices were operated at a constant current density of 20, 40, 60 and 80 mA/cm².

The half-life times for these devices are given in Table 1.

EXAMPLE 6

For Device F, the 37.5 nm Alq emission layer contained 2% DCJTB luminescent dopant and 10% rubrene exciton dopant.

EXAMPLE 7

For Device G, the 37.5 nm Alq emission layer contained 2% DCJTB luminescent dopant and 10% NPB hole trapping dopant.

EXAMPLE 8

For Device H, the 37.5 nm Alq emission layer contained three dopants, 2% DCJTB+5% rubrene+5% NPB.

The luminance characteristics of these are included in Table 1. The Device E has 2.05 cd/A luminance yield at 20

TABLE I

Luminance performance of devices A to H with different dopants

| Device | Luminescent layer | Luminance Yield @ 20 mA/cm2 (cd/A) | EL Peak Wavelength (nm) | CIEx | CIEy | Drivevoltage @ 20 mA/cm2 (volts) |
|---|---|---|---|---|---|---|
| Device A | Alq | 3.17 | 524 | 0.334 | 0.531 | 8.50 |
| Device B | Alq + 10% Rubrene | 4.68 | 568 | 0.519 | 0.476 | 7.90 |
| Device C | Alq + 10% NPB | 3.26 | 528 | 0.346 | 0.538 | 8.70 |
| Device D | Alq + 5% Rubrene + 5% NPB | 4.95 | 568 | 0.518 | 0.478 | 8.30 |
| Device E | Alq + 2% DCJT-B | 2.05 | 628 | 0.640 | 0.355 | 9.20 |
| Device F | Alq + 2% DCJT-B + 10% Rubrene | 2.41 | 632 | 0.650 | 0.345 | 9.00 |
| Device G | Alq + 2% DCJT-B + 10% NPB | 2.08 | 628 | 0.645 | 0.353 | 9.10 |
| Device H | Alq + 2% DCJT-B + 5% NPB + 5% Rubrene | 2.76 | 632 | 0.650 | 0.350 | 8.50 |

Figure 4:
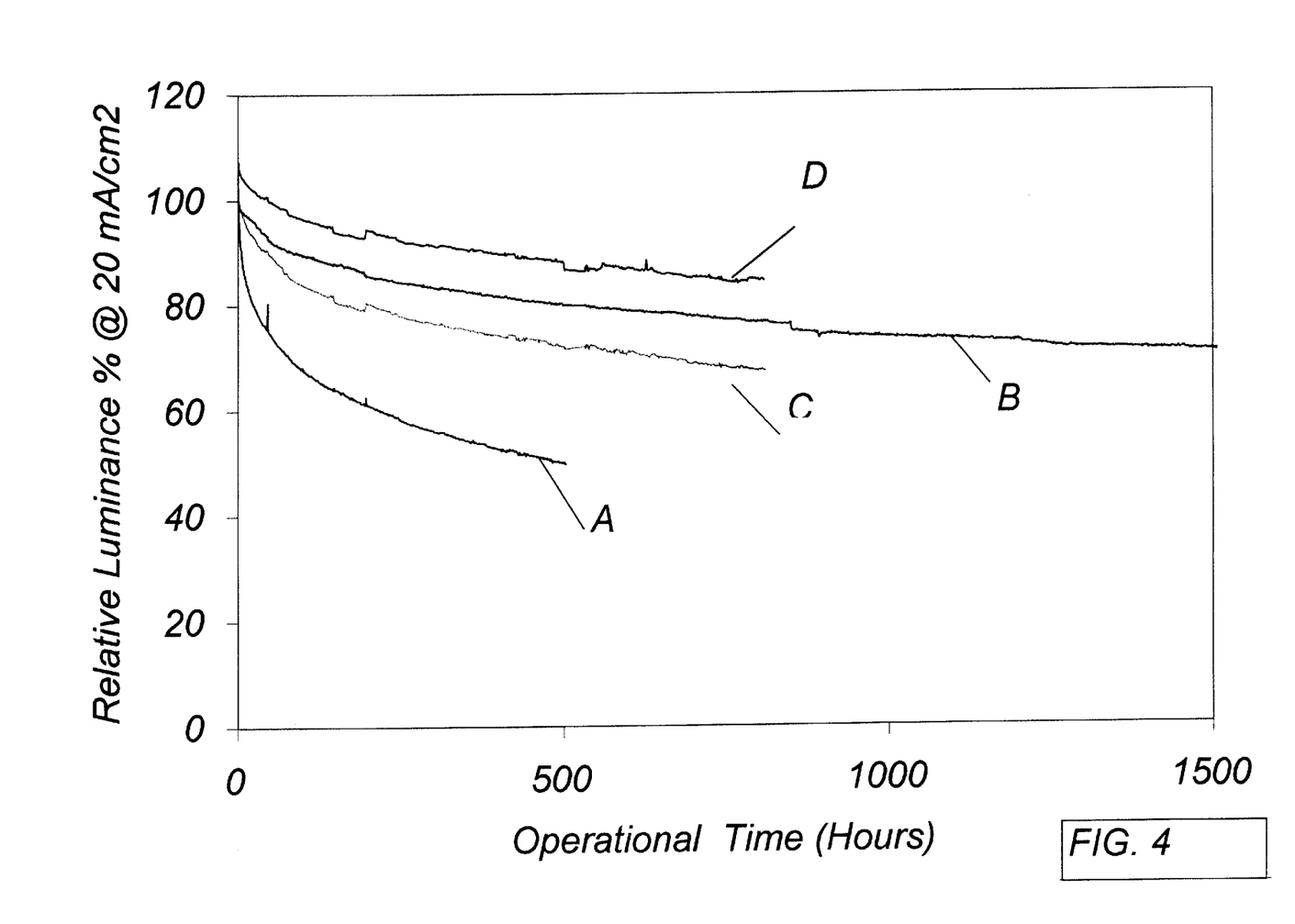
FIG. 4 shows the relative normalized operational luminance as a function of operation time for doped EL devices.

FIG. 4 shows the normalized luminance as a function of operating time at 20 mA/cm² current density for the four Devices A to D. The synergetic effect of doping exciton trapping dopant and hole trapping dopant was found with doping simultaneously with NPB and rubrene into Alq host. The decrease in luminance yield for Device D was the lowest as compared to the Devices A, B, and C. The change in luminance was unexpectedly lower than that possible from the additive effects of both dopants. The synergetic effect was such that better operational stability and efficiency were obtained at lower concentrations of the dopants. This resulted in more than two times improvement in operating lifetime and 10–20% increase in luminance efficiency which could not be achieved with using either of the dopants with any amounts of doping concentrations.

Figure 5:
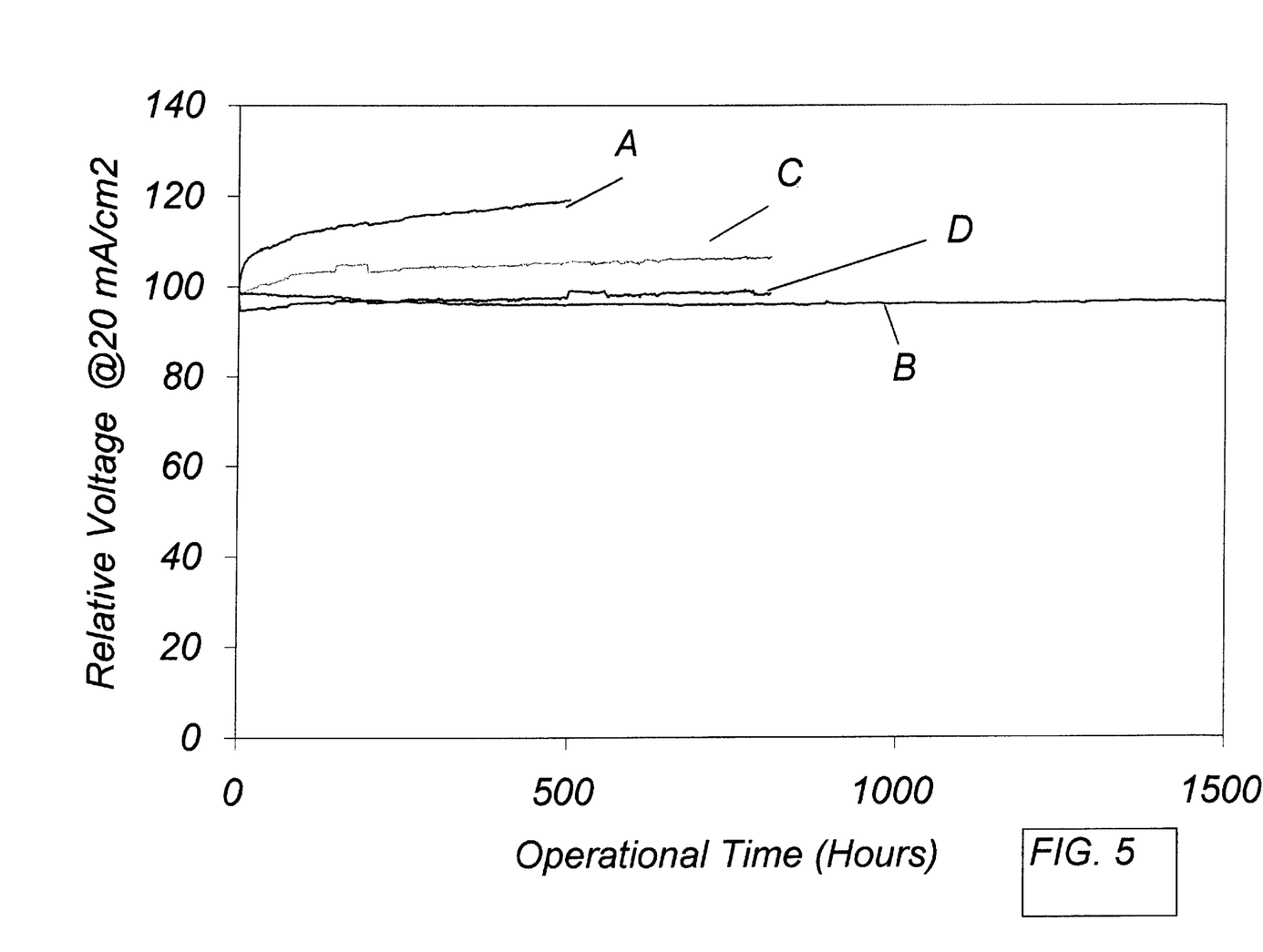
FIG. 5 shows the relative driving voltage as a function of operation time for the EL devices of FIG. 4.

FIG. 5 shows the operational stability of the drive voltage at 20 mA/cm² current density. Unexpectedly, again the Device D with the Alq emission layer doped with both rubrene and NPB dopants showed minimal change in the drive voltage. Thus, Device D has the highest operational stability among the four devices. Thus, the normalized luminance and the drive voltage was stable for a longer time for the devices of this invention.

EXAMPLES 5–8

In accordance with the method described for Devices A–D, except that the dopants in the 37.5 nm Alq emission layer.

EXAMPLE 5

For Device E, the 37.5 nm Alq emission layer contained 2% DCJTB luminescent dopant.

mA/cm² current density. This device has EL peak position at 628 nm and has red color having color coordinates CIEx=0.64 and CIEy=0.35. When the Alq emission layer was doped with 2% DCJTB+10% rubrene, the luminance yield for Device F increased to 2.41 cd/A @20 mA/cm². The EL peak position is at 628 nm and has red color having color coordinates CIEx=0.64 and CIEy=0.34. When the Alq emission layer was doped with 2% DCJTB+10% NPB for Device G, the luminance yield was 2.06 cd/A. The EL peak position was at 628 nm giving red emission at 628 nm and color coordinates CIEx=0.64 and CIEy=0.34. When the Alq emission layer was co-doped three dopants, 2% DCJTB+5% rubrene+5% NPB, the luminance yield for the Device H was 2.76 cd/A and the EL peak position was at 628 nm giving red emission at 628 nm and color coordinates of CIEx=0.65 and CIEy=0.34. The drive voltage at 20 mA/cm² current density was lowest for the Device H. Thus the Device H prepared with the Alq host emission layer doped with three dopants: DCJTB luminescent dopant; rubrene exciton dopant and NPB hole trap dopant have higher luminance efficiency; lowest drive voltage and excellent color coordinates.

The operational stability of these encapsulated devices has been found by measuring the changes in the luminance and the drive voltage as a function of time. Again four icons of each device was operated at the current density of 20, 40, 60 and 80 20 mA/cm². The half-life times for these devices are included in Table 2.

TABLE 2

Operational Half-life times of devices A to H with different dopants

| Device | Luminescent layer | Half life @ J = 80 mA/cm2 (Hours) | Half life @ J = 60 mA/cm2 (Hours) | Half life @ J = 40 mA/cm2 (Hours) | Half life @ J = 20 mA/cm2 (Hours) |
|---|---|---|---|---|---|
| Device A | Alq | 156 | 161 | 38 | 1000 |
| Device B | Alq + 10% Rubrene | 455 | 542 | 1103 | 3000 |
| Device C | Alq + 10% NPB | 348 | 525 | 1025 | 3250 |
| Device D | Alq + 5% Rubrene + 5% NPB | 900 | 1300 | 2200 | 5000 |
| Device E | Alq + 2% DCJT-B | 361 | 510 | 901 | 2250 |
| Device F | Alq + 2% DCJT-B + 10% Rubrene | 487 | 710 | 1482 | 3500 |
| Device G | Alq + 2% DCJT-B + 10% NPB | 563 | 822 | 1557 | 4000 |
| Device H | Alq + 2% DCJT-B + 5% NPB + 5% Rubrene | 901 | 1353 | 2250 | >6000 |

Figure 6:
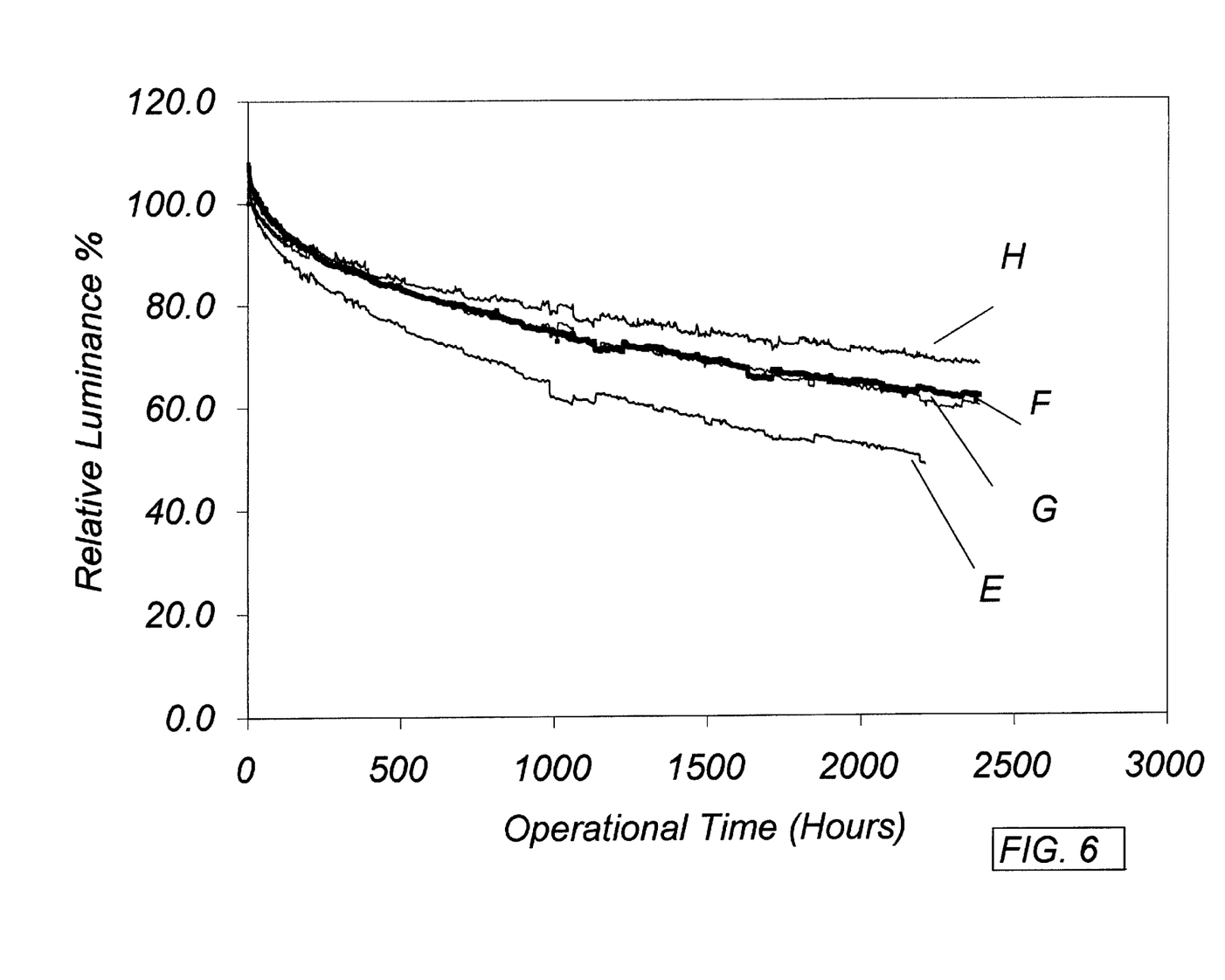
FIG. 6 shows the relative normalized luminance as a function of operation time for doped EL devices.

FIG. 6 shows the operational luminance stability of the four Devices E to H. It is obvious that Device H prepared with all the three dopants, 2% DCJTB+5% NPB+5% rubrene into the Alq host layer has the highest operational stability. This device also has the best color coordinates and the highest luminance efficiency and lowest drive voltage.

Figure 7:
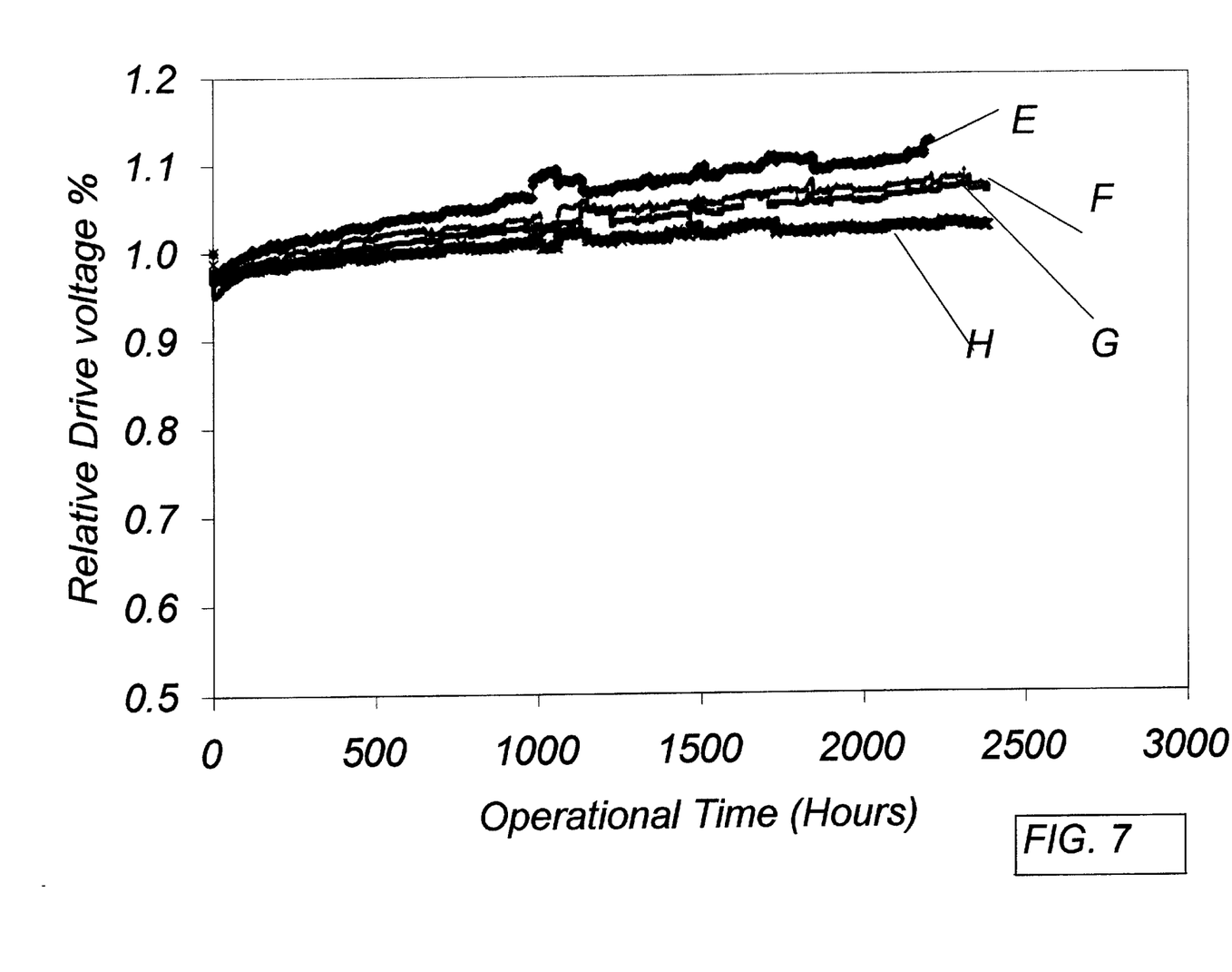
FIG. 7 shows the relative driving voltage as a function of operation time for the EL devices of FIG. 6.

FIG. 7 shows the operational voltage stability of the above four Devices E to H. Again, the Device H prepared with all the three dopants, 2% DCJTB+5% NPB+5% rubrene in Alq host layer has minimal increase in the drive voltage over the operational time and thus the highest operational voltage stability.

With the addition of third luminescent dopant, such as DCJTB, excellent red emission color coordinates were obtained with high luminance efficiency and lowest drive voltage, which could not be achieved with any other combination.

Thus the EL devices of this invention prepared with Alq emission containing rubrene and NPB with or without DCJTB luminescent dopant have significantly improved operational fade stability. These devices have higher luminance yield and lower drive voltage. These devices can be operated at higher current density with minimum degradation in the color coordinates and the luminance efficiency. The devices with the emission layer containing all the three dopants, rubrene exciton trap, NPB hole trap and DCJTB luminescent dopant, have the highest luminance yield, lowest drive voltage, best chromiticity and the highest operational stability.

The invention has been described in detail with particular reference to certain preferred embodiments thereof, but it will be understood that variations and modifications can be effected within the spirit and scope of the invention.

PARTS LIST

100 EL device with the simple structure
104 anode layer
106 cathode contact
108 organic electroluminescent layer
200 multilayer organic light-emitting device
202 transparent substrate
204 electrically conducting transparent anode
204*a* transparent anode layer
204*b* hole injection layer
206 cathode structure
208 organic light-emitting structure
210 hole-transporting layer
212 organic luminescent layer
214 electron-transporting-layer

What is claimed is:

1. An organic luminescent layer for use in an electroluminescent device with improved operating life, comprising:
   a) an organic host material capable of sustaining both hole and electron injection and recombination wherein the host material includes Alq; and and
   b) at least three dopants:
      i) a first dopant capable of accepting energy of electron hole combination in the host material;
      ii) a second dopant capable of trapping the holes from the host material; and
      iii) a third dopant capable of accepting energy from the electron hole combination in the host material and accepting energy transferred from the second dopant;
   c) the first dopant being selected so that the bandgap energy of the first dopant is less than the bandgap energy of the host material; and
   d) the second dopant being selected to have a hole trapping energy level above the valence band of the host material; and
   e) the third dopant having a bandgap energy less than the bandgap energy of the first dopant.

2. The organic luminescent layer of claim 1 wherein the first dopant includes a fluorescent hydrocarbon compound containing a polycyclic benzoid chromophoric unit.

3. The organic luminescent layer of claim 1 wherein the second dopant includes aromatic tertiary amines.

4. The organic luminescent layer of claim 3 wherein the aromatic tertiary amines are tetraaryldiamines.

5. The organic luminescent layer of claim 4 wherein the aromatic tertiary amines include tetraaryldiamines having the formula:

wherein:
- Ar, $Ar^1$, $Ar^2$ and $Ar^3$ are independently selected from among phenyl, biphenyl and naphthyl moieties;
- L is a divalent naphthylene moiety or $d_n$;
- d is a phenylene moiety;
- n is an integer of from 1 to 4, and at least one of Ar, $Ar^1$, $Ar^2$ and $Ar^3$ is a naphthyl moiety when L is $d_n$.

6. The organic luminescent layer of claim 1 wherein the third dopant includes DCM class of materials.

7. The organic luminescent layer of claim 1 wherein the third dopant includes DCJTB.

8. The organic luminescent layer of claim 1 wherein concentration of the first dopant is in a range of 0.5% to 25% by volume of the organic luminescent layer.

9. The organic luminescent layer of claim 1 wherein concentration of the second dopant is in a range of 0.5% to 25% by volume of the organic luminescent layer.

10. The organic luminescent layer of claim 1 wherein concentration of the third dopant is greater than 0.05% and less than 5% by volume of the organic luminescent layer.

11. The organic luminescent layer of claim 1 wherein the combined concentration of the firsts second, and third dopants is greater than 1.05% and less than 55% by volume of the organic luminescent layer.

* * * * *